(12) United States Patent
Yu et al.

(10) Patent No.: US 6,465,313 B1
(45) Date of Patent: Oct. 15, 2002

(54) SOI MOSFET WITH GRADED SOURCE/DRAIN SILICIDE

(75) Inventors: Bin Yu, Cupertino, CA (US); Ralf van Bentum, Radebeul (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/900,403

(22) Filed: Jul. 5, 2001

(51) Int. Cl.$^7$ .............................................. H01L 21/336
(52) U.S. Cl. ...................... 438/300; 438/295; 438/303; 438/683; 257/347; 257/382; 257/384
(58) Field of Search ................................ 438/295, 300, 438/303, 683; 257/347, 382, 384

(56) References Cited

U.S. PATENT DOCUMENTS

| | | | |
|---|---|---|---|
| 5,352,631 A | 10/1994 | Sitaram et al. | 438/300 |
| 6,051,473 A | 4/2000 | Ishida et al. | 438/300 |
| 6,121,100 A * | 9/2000 | Andideh et al. | 257/336 |
| 6,214,679 B1 * | 4/2001 | Murthy et al. | 438/300 |
| 6,340,829 B1 * | 1/2002 | Hirano et al. | 257/347 |
| 6,346,732 B1 * | 2/2002 | Mizushima et al. | 257/382 |

* cited by examiner

Primary Examiner—Trung Dang
(74) Attorney, Agent, or Firm—Renner, Otto, Boisselle & Sklar, LLP

(57) ABSTRACT

A semiconductor device and a method of forming same are disclosed. The device includes an SOI wafer including a semiconductor layer, a substrate and a buried insulator layer therebetween; the semiconductor layer including a source region, a drain region, and a body region disposed between the source and drain regions, the source and drain regions including respective source and extensions which extend partially laterally inwardly towards one another above the body region; and, a gate on the semiconductor layer disposed above the body region, the gate being operatively arranged with the source, drain, and body regions to form a transistor; wherein the source and drain regions include source and drain deep doped regions on opposite sides of and laterally spaced from the gate and laterally adjacent to the respective source and drain extensions, and wherein the source and drain extensions include respective source and drain silicide extension portions disposed therein of a first thickness and the source and drain deep doped regions include respective source and drain silicide deep portions disposed therein of a second thickness relatively thicker than the first thickness.

21 Claims, 6 Drawing Sheets

SOI MOSFET WITH GRADED SOURCE/ DRAIN SILICIDE

TECHNICAL FIELD

The invention relates generally to semiconductor-on-insulator devices and methods for forming the same. The invention relates particularly to semiconductor-on-insulator devices and methods for forming which avoid or reduce floating body effects.

BACKGROUND ART

Semiconductor on insulator (SOI) materials offer potential advantages over bulk materials for the fabrication of high performance integrated circuits. Dielectric isolation and reduction of parasitic capacitance improve circuit performance, and eliminate latch-up in CMOS circuits. In addition, circuit layout in SOI can be greatly simplified and packing density greatly increased if the devices are made without body contacts (i.e., if the body regions of these devices are "floating"). However, partially-depleted metal oxide semiconductor field effect transistors (MOSFETs) on SOI materials typically exhibit parasitic effects due to the presence of the floating body ("floating body effects"). These floating body effects may result in undesirable performance in SOI devices.

SUMMARY OF THE INVENTION

According to one aspect of the invention, the invention is a semiconductor device. The device includes an SOI wafer including a semiconductor layer, a substrate and a buried insulator layer therebetween; the semiconductor layer including a source region, a drain region, and a body region disposed between the source and drain regions, the source and drain regions including respective source and drain extensions which extend partially laterally inwardly towards one another above the body region; and, a gate on the semiconductor layer disposed above the body region, the gate being operatively arranged with the source, drain, and body regions to form a transistor; wherein the source and drain regions include source and drain deep doped regions on opposite sides of and laterally spaced from the gate and laterally adjacent to the respective source and drain extensions, and wherein the source and drain extensions include respective source and drain silicide extension portions disposed therein of a first thickness and the source and drain deep doped regions include respective source and drain silicide deep portions disposed therein of a second thickness relatively thicker than the first thickness.

According to another aspect of the invention, the invention is a method of forming a semiconductor device. The method includes the steps of forming an SOI wafer having a semiconductor layer, a substrate and a buried insulator layer therebetween, wherein the semiconductor layer includes a source region, a drain region, and a body region disposed between the source and drain regions, the source and drain regions including respective source and drain extensions which extend partially laterally inwardly towards one another above the body region; forming a gate on the semiconductor layer above the body region; forming source and drain deep doped regions on opposite sides of and laterally spaced from the gate and laterally adjacent to the respective source and drain extensions; and, forming source and drain silicide extension portions of a first thickness in the respective source and drain extensions and source and drain silicide deep portions of a second thickness relatively thicker than the first thickness in the respective source and drain deep doped regions.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DISCLOSURE OF THE INVENTION

Figure 1:
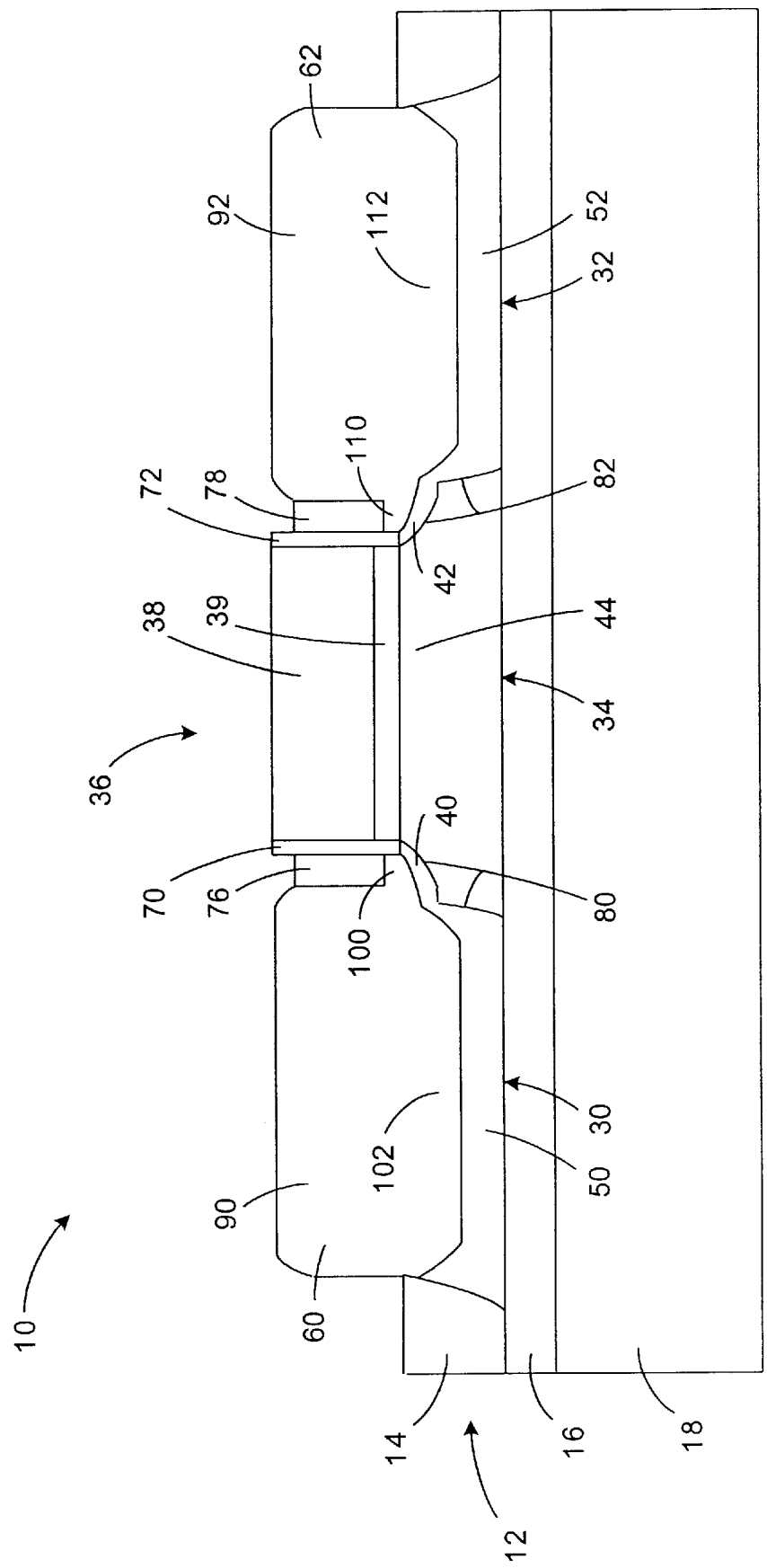
FIG. 1 is a cross-sectional view of a semiconductor-on-insulator field effect transistor in accordance with the present invention.

In the detailed description which follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Referring initially to FIG. 1, a semiconductor-on-insulator device 10 according to the present invention is shown. In the illustrated embodiment, the device 10 is a transistor, and more particularly a partially depleted metal oxide semiconductor field effect transistor. The semiconductor device 10 is fabricated in conjunction with a semiconductor-on-insulator (SOI) wafer 12. The SOI wafer 12 includes an active layer 14 (also referred to as a semiconductor layer 14), a buried insulator layer 16 (also referred to as a buried oxide (BOX) layer 16), and a substrate 18. In one embodiment, the active layer 14 and the substrate 18 are made from silicon, and the BOX layer 16 is made from an oxide, such as silicon oxide or $SiO_2$. The wafer 12 can be formed using techniques such as direct wafer bonding or a separated by implanted oxygen (SIMOX) technique.

Within the active layer 14, isolation regions 20 define the size and placement of an active region 22 in which the SOI device 10 is fabricated. More specifically, within the active region 22 for the SOI device 10, the SOI device 10 includes a source region 30, a drain region 32, and a body region 34 disposed therebetween. The source region 30 and the drain region 32 have N+ doping and the body region 34 has P doping, making the SOI device 10 an N-channel device. It will be appreciated that, alternatively, the source region 30, the drain region 32 and the body region 34 can have any other appropriate doping. For example, the source region 30 and the drain region 32 can have P+ doping and the body region 34 can have N doping (such an SOI device being a P-channel device). Alternatively, the body region 34 can remain undoped.

A gate 36 is disposed on top of the body region 34. The gate 36 includes a gate electrode portion 38, made from a conductive material such as polysilicon. Disposed between the gate electrode portion 38 and the body region 34 is a gate oxide layer, or gate dielectric 39. The gate dielectric 39 can be formed from a material such as silicon dioxide, silicon oxynitride, silicon nitride ($Si_3N_4$), or the like. Alternatively, other gate stack arrangements, as are known in the art, can be used for the gate 36.

The source and drain regions 30 and 32 include respective extensions 40 and 42 and deep doped regions 50 and 52. The source and drain regions 30 and 32 are raised to form raised regions 60 and 62. The extensions 40 and 42 extend underneath liners 70 and 72 adjacent the gate 36. The body region 34 includes a channel 44, which extends laterally between the extensions 40 and 42. As is further described below, the raised regions 60 and 62 are laterally spaced from opposite sides of the gate 36 by spacers 76 and 78 disposed adjacent to the liners 70 and 72.

The source region 30 adjacent the body region 34 forms a source/body junction 80. Similarly, the drain region 32 adjacent the body region 34 forms a drain/body junction 82.

The source and drain regions 30 and 32 also include respective silicide regions 90 and 92 on opposite sides of the gate 36, and a gate silicide region (not shown), if desired, in the gate 36. The silicide regions 90 and 92 extend vertically downward into the respective source and drain deep doped regions 50 and 52, and vertically downward into the source and drain extensions 40 and 42. As is shown in FIG. 1, the depth (i.e., vertical height) of the suicide regions 90 and 92 is greater in the deep doped regions 50 and 52 than in the extensions 40 and 42, this difference being facilitated, as described below, by a method in which two different thickness metal layers are utilized, a first thickness for the extensions 40 and 42 and a second thickness for the deep doped regions 50 and 52, in forming the suicide regions 90 and 92. In the illustrated embodiment, the source and drain silicide regions 90 and 92 are substantially symmetric about the gate 36, although it will be appreciated that the silicide regions 90 and 92 may be asymmetrical relative to the gate 36. The silicide regions 90 and 92 have respective exposed surfaces (not shown) for external electrical connection.

The source and drain silicide regions 90 and 92 include respective silicide extension portions 100 and 110 in the source and drain extensions 40 and 42, and silicide deep portions 102 and 112 in the source and drain deep implant regions 50 and 52.

According to the invention, the proximity of the silicide regions 90 and 92 to the respective source/body and drain/body junctions 80 and 82 makes the junctions 80 and 82 "leaky", thus providing a path for carriers to reach the channel 44 of the device 10. This reduces floating body effects. As a result, overall operational performance of the device is improved. Also, utilizing two different thickness metal layers for the extensions 40 and 42 and the deep implant regions 50 and 52 during silicide formation facilitates locating the silicide regions 90 and 92 in close proximity to the respective source/body and drain/body junctions 80 and 82. This differentiation in the silicide regions 90 and 92 substantially reduces contact resistance without losing the advantage of the reduced floating body effects.

Figure 2:
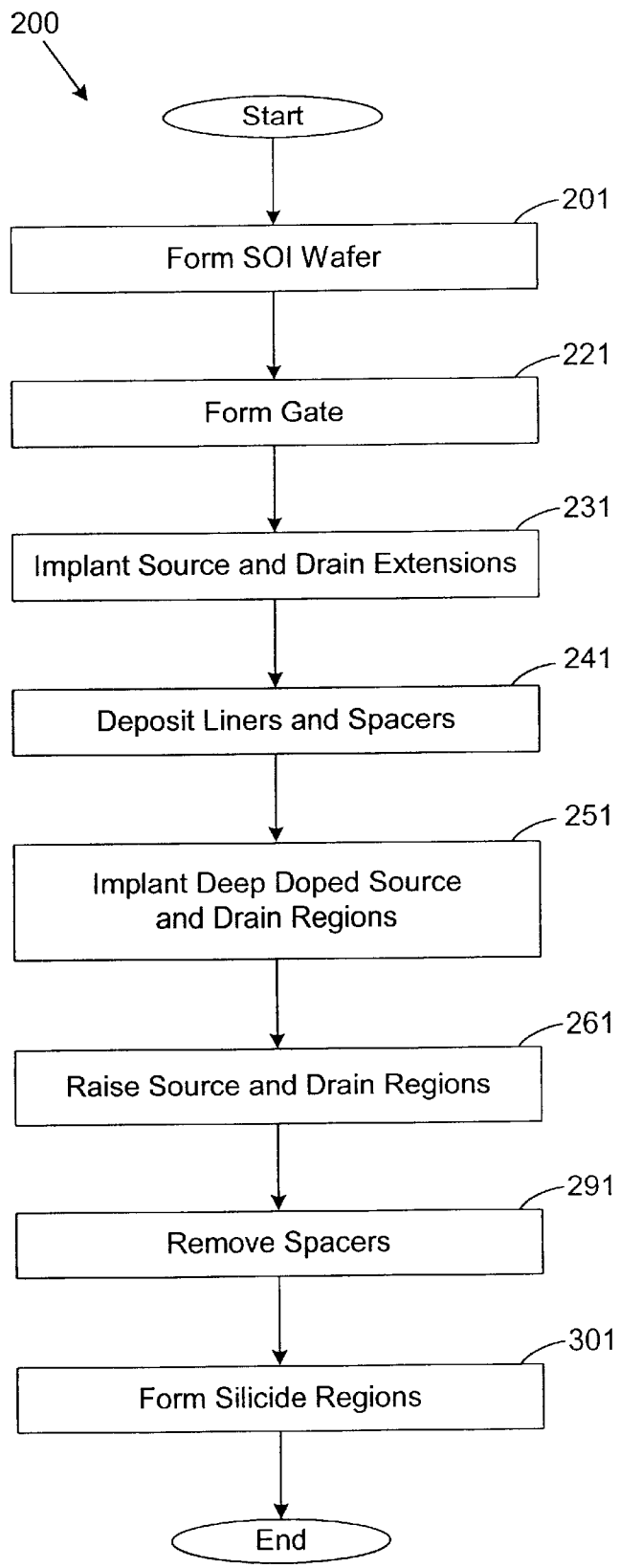
FIG. 2 is a flow chart of a method of making a semiconductor-on-insulator field effect transistor in accordance with the present invention.

FIG. 2 is a flow chart of a method 200 for forming the semiconductor device 10 shown in FIG. 1 and described above.

Figure 3:
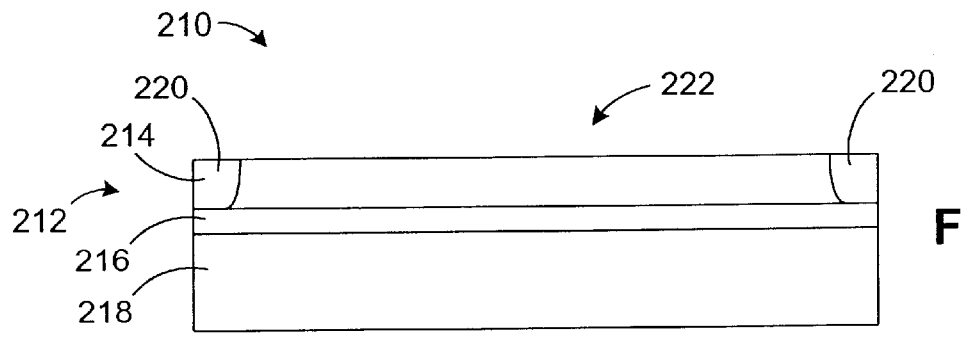
FIGS. 3–11 and 11A are cross-sectional views of intermediate structures which illustrate a method of forming a semiconductor device in accordance with the present invention.

Initially at step 201, a semiconductor-on-insulator (SOI) wafer 212 (FIG. 3) is formed. The SOI wafer 212 includes a bulk semiconductor region, or substrate 218, and an active layer, also referred to as a surface semiconductor layer 214, with a buried insulator layer 216 therebetween. The semiconductor layer 214 may be suitably doped for the formation of a P-channel or an N-channel device. The wafer 212 may be formed using techniques known in the art such as wafer bonding or SIMOX. STI regions 220 are formed and define the size and placement of an active region 222.

Figure 4:
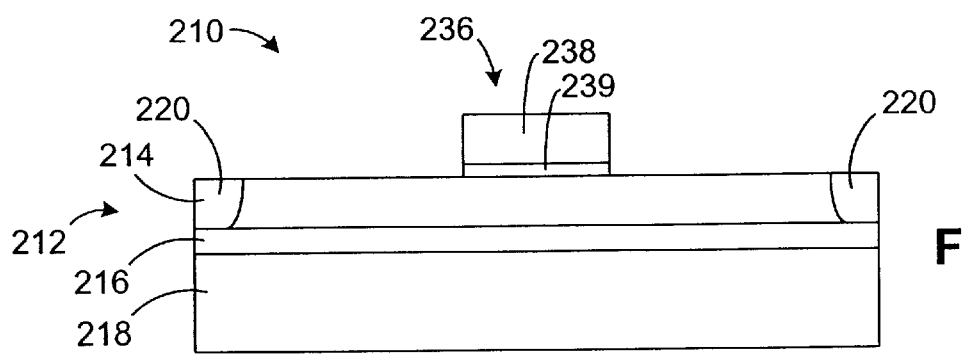

Thereafter, in step 221, illustrated in FIG. 4, a gate stack 236 (also referred to herein as a gate) including a gate electrode 238 and a gate dielectric 239 are formed on the SOI wafer 212 as part of a semiconductor device 210. The gate electrode 238 and the gate dielectric 239 may be formed on the wafer 212 by suitable, well-known methods. For example, a layer of dielectric material, for example $SiO_2$ or $Si_3N_4$, may be deposited on and/or grown on the semiconductor layer 214. Thereafter a layer of gate electrode material may be deposited on the dielectric material. An exemplary gate electrode material is polysilicon, which may be deposited, for example, using low pressure chemical vapor deposition (LPCVD) processing techniques. It will be appreciated that a wide variety of other suitable methods and structures (e.g., multi-layers) for gate formation may be employed in this step.

Figure 5:
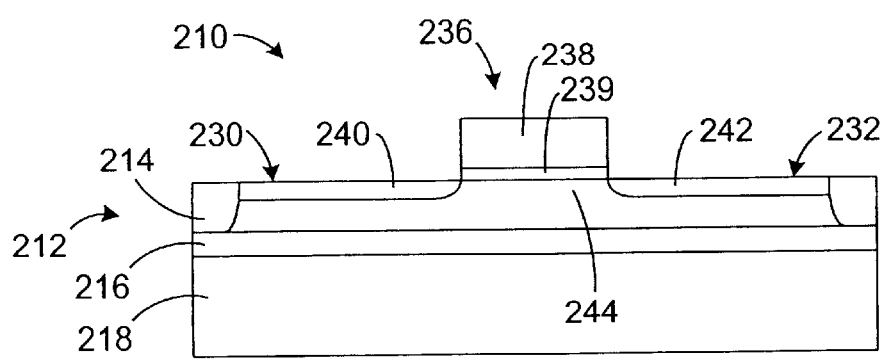

In step 231, illustrated in FIG. 5, shallow doping implantation is employed to create respective source and drain extensions 240 and 242 in the semiconductor layer 214. An exemplary depth (i.e., vertical height) of the source and drain extensions 240 and 242 is between about 100 Angstroms (Å) and about 300 Angstroms (Å). The extensions 240 and 242 form part of respective source and drain regions 230 and 232, which are on opposite sides of a body region 234 (see FIG. 7), as is further described below. The body region 234 includes a channel 244 in the upper portion thereof between the extensions 240 and 242 and below the gate 236, as is also further described below.

Exemplary ions for the shallow doping implantation are phosphorous and arsenic, an exemplary energy range for the implantation is about 5 to about 80 KeV, and an exemplary range of doping for the implantation is between about $1 \times 10^{14}$ and about $5 \times 10^{15}$ atoms/cm². The type of doping for the extensions 240 and 242 is the opposite of the conductivity type of the remainder of the semiconductor layer 214. Thus if the semiconductor layer 214 has N-type doping, the extensions 240 and 242 will be P-doped. Conversely, if the semiconductor layer 214 has P-type doping, the extensions 240 and 242 will have N-type doping.

Figure 6:
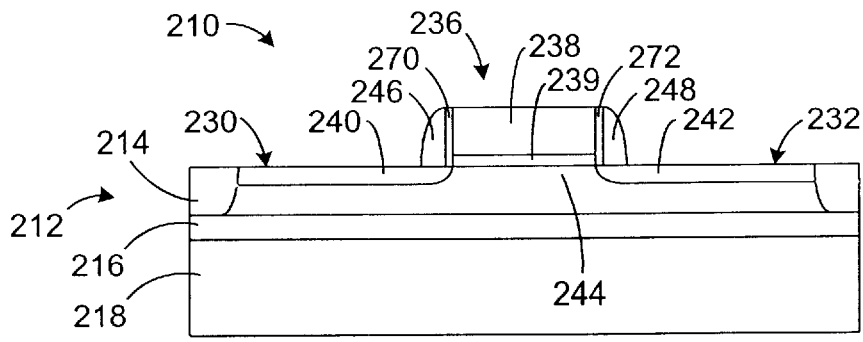

Referring to FIG. 6, in step 241 liners 270 and 272 are formed adjacent the flanks of the gate 236 by methods known in the art. For example, the liner can be comprised of an oxide thermally grown or deposited using chemical vapor deposition. The lateral width of the liners 270 and 272 is about 100 to about 200 Angstroms (Å).

Spacers 246 and 248 are then formed adjacent the respective liners 270 and 272. The spacers 246 and 248 are formed using conventional techniques. The spacers 246 and 248 are made from a material such as silicon oxide ($SiO_2$) or a nitride (e.g., $Si_3Na$). The lateral width of the spacers 246 and 248 at the surface of the semiconductor layer 214 is about 300 to about 600 Angstroms (Å). It will be appreciated that other thicknesses may be suitable for the liners 270 and 272 and the spacers 246 and 248.

Figure 7:
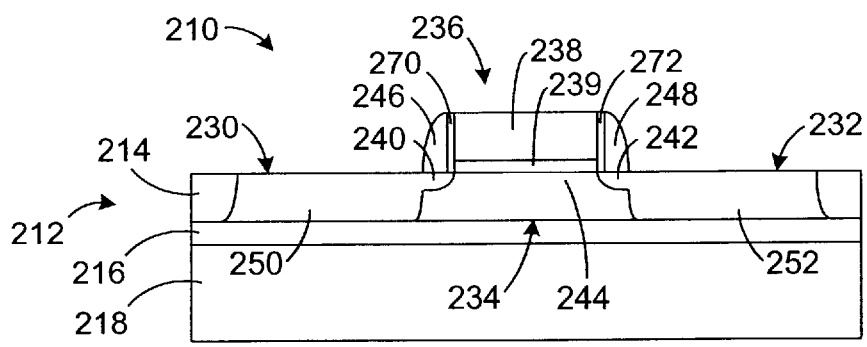

In step 251, illustrated in FIG. 7, source/drain deep implantation is used to form source and drain deep doped regions 250 and 252. For an N-channel device, N-type deep implantation is made by implanting arsenic (As) at, for example, an energy of about 10 KeV to about 50 KeV and a dose of about $1 \times 10^{15}$ atoms/cm$^2$ to about $5 \times 10^{15}$ atoms/cm$^2$. For a P-channel device, P-type deep implantation is made by implanting boron fluoride (BF$_2$) at, for example, an energy of about 10 kev to about 50 kev and a dose of about $1 \times 10^{15}$ atoms/cm$^2$ to about $5 \times 10^{15}$ atoms/cm$^2$. The gate 236, liners 270 and 272, and the spacers 246 and 248 act as a self aligned mask, blocking implantation of the portion of the semiconductor layer 214 beneath the gate 236, liners 270 and 272, and spacers 246 and 248. Following deep implantation, a thermal cycle to recrystalize the silicon is conducted. An exemplary thermal cycle is low temperature anneal or rapid thermal annealing (RTA).

Figure 8:
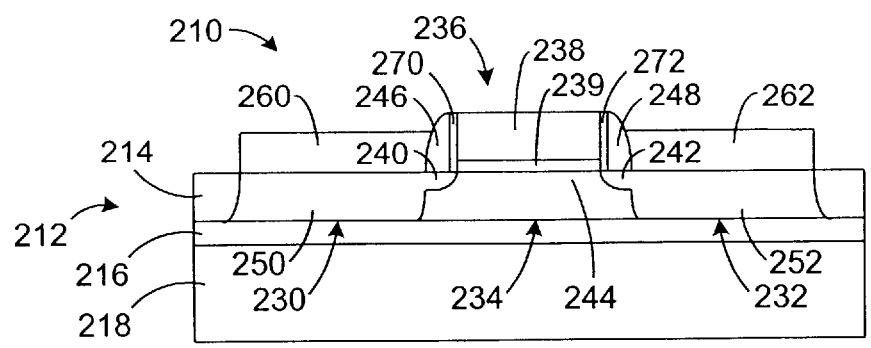

In step 261, illustrated in FIG. 8, selective silicon epitaxy is used to vertically raise the semiconductor layer 214 and thus form source and drain raised regions 260 and 262 in the semiconductor layer 114. Following the epitaxy growth, the semiconductor layer 214 is subjected to suitable ion implantation. For example, for an N-channel device, N-type implantation is made by implanting arsenic (As) at, for example, an energy of about 10 kev to about 50 kev and a dose of about $1 \times 10^{15}$ atoms/cm$^2$ to about $6 \times 10^{15}$ atoms/cm$^2$. A thermal cycle is then conducted to recrystalize the silicon of the raised regions 260 and 262. For example, the raised regions 260 and 262 may be annealed at a temperature of about 900° C. to about 1050° C. and for a length of time of about five minutes to about 60 minutes. An exemplary depth (i.e., vertical height) of the source and drain raised regions 260 and 262 from the surface of the "pre-raised" semiconductor layer 214 is between about 200 Angstroms (Å) and about 500 Angstroms (Å). It will be appreciated that the thermal cycle for forming the deep doped regions may be performed during the formation of the raised regions 260 and 262.

Figure 9:
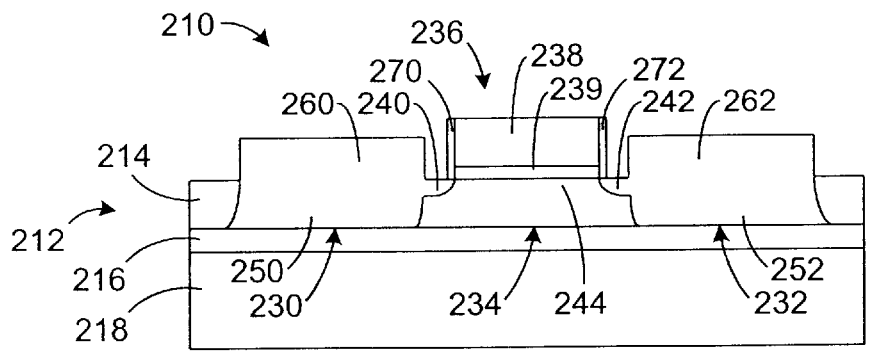

In step 291, as illustrated in FIG. 9, the spacers 246 and 248 are removed. This provides gaps between the liners 270 and 272 and the respective source and drain raised regions 260 and 262.

Figure 10:
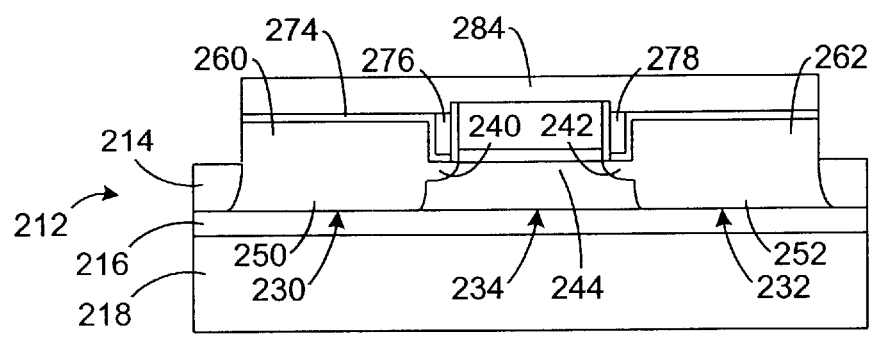

In step 301, as illustrated in FIG. 10, silicide formation is initiated by depositing, as by sputtering, chemical vapor deposition (CVP), or evaporation, a relatively thin first layer 274 of metal upon the source and drain extensions 240 and 242, and the source and drain raised regions 260 and 262. Spacers 276 and 278 are then inserted on the first metal layer 274 above the source and drain extensions 240 and 242. A relatively thicker second layer 284 of metal is then deposited on the first metal layer 274 and, if desired, on the spacers 276 and 278 and the gate 236. An exemplary thickness of the first metal layer 274 is about three nm to about 10 nm, and an exemplary thickness of the second metal layer 284 is about five nm to about 15 nm. The metal is the same for both first and second metal layers 274 and 284 and may be titanium (TiSi$_2$), cobalt (CoSi$_2$), nickel (NiSi), or any other metal which is suitable for reacting with the semiconductor material to form silicide.

The silicide is formed by a suitable method, an exemplary method being to raise the temperature of the semiconductor device 210 to a suitable level, for example, about 400 (for NiSi, for example) and about 800° C. (for CoSi$_2$, for example), for a suitable length of time, for example, between about 30 seconds and about 60 seconds. It will be appreciated that other temperatures and heating times may be employed.

Figure 11:
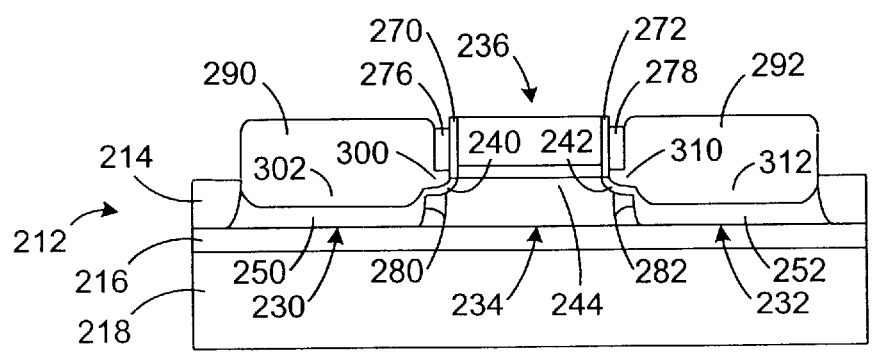

Referring to FIG. 11, the silicidation forms a source silicide region 290 and a drain silicide region 292 in the respective source and drain regions 230 and 232. It will be appreciated that a gate silicide region (not shown) may be formed, if desired, in the gate 236. The source and drain silicide regions 290 and 292 include respective silicide extension portions 300 and 310 in the source and drain extensions 240 and 242, and silicide deep portions 302 and 312 in the source and drain deep implant regions 250 and 252.

The source region 230 of the semiconductor layer 214 is thereby formed, the source region 230 including the source extension 240, the source deep implant 250, and the source silicide region 290 therein. Similarly, the drain region 232 is formed, the drain region 232 including the drain extension 242, the drain deep implant 252, and the drain silicide region 292 therein. The body region 234 is defined as the region of the semiconductor layer 214 between the source region 230 and the drain region 232, and includes the channel 244 in the upper portion thereof between the extensions 240 and 242 and below the gate 236.

Figure 11A:
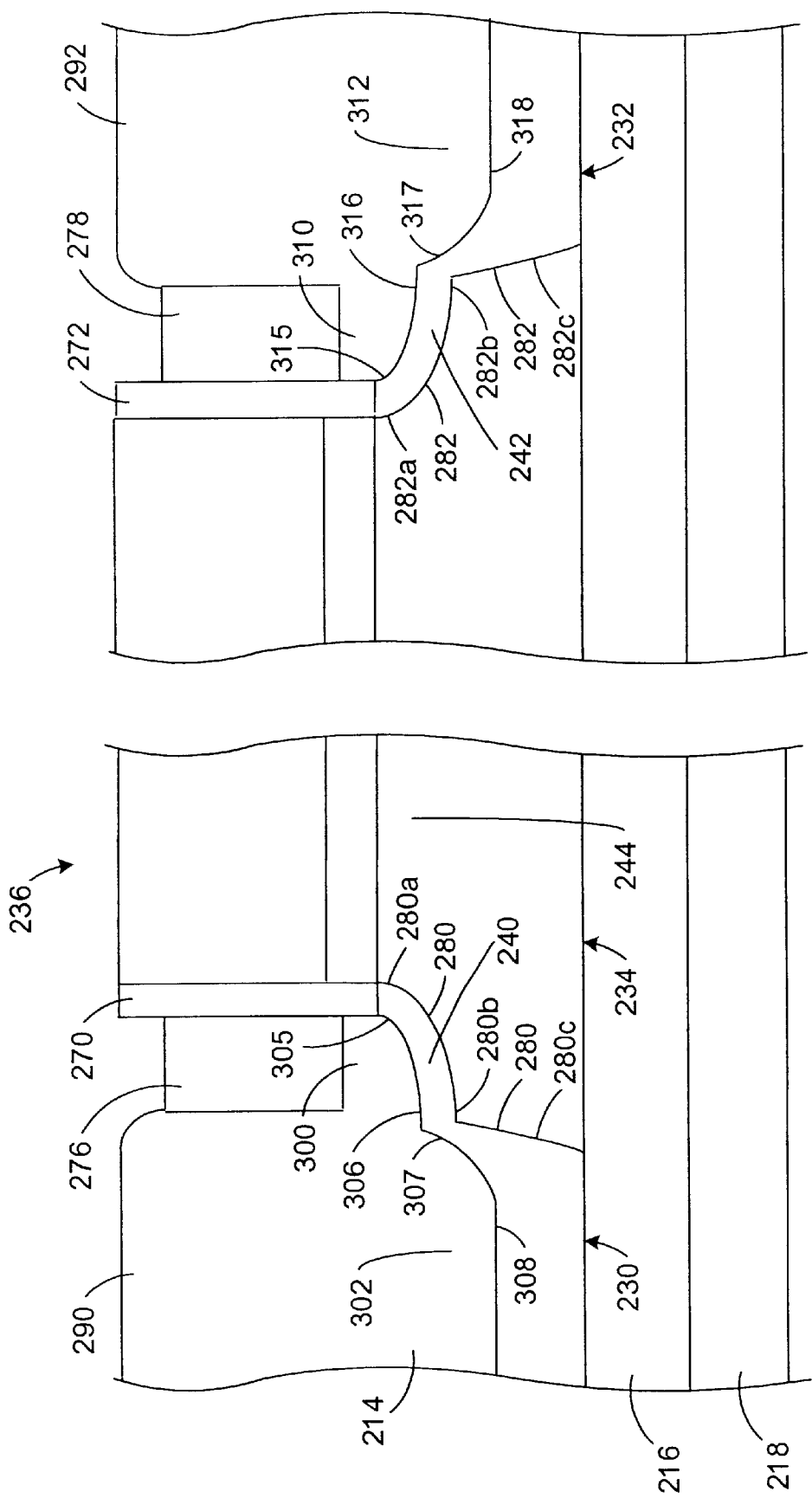

The source region 230 adjacent the body region 234 forms a source/body junction 280. More particularly, as is illustrated in FIG. 11A, the source extension 240 has a vertical tangential portion which interfaces the body region 234 at a vertical interface region 280a, a horizontal tangential portion which interfaces the body region 234 at a horizontal interface region 280b, and another vertical tangential portion which interfaces the body region 234 at a vertical interface region 280c, the interface regions 280a, 280b and 280c together forming the source/body junction 280. Similarly, the drain region 232 adjacent the body region 234 forms a source/body junction 282. More particularly, the drain extension 242 has a vertical tangential portion which interfaces the body region 234 at a vertical interface region 282a, a horizontal tangential portion which interfaces the body region 234 at a horizontal interface region 282b, and another vertical tangential portion which interfaces the body region 234 at a vertical interface region 282c, the interface regions 282a, 282b and 282c together forming the source/body junction 282.

The parameters for the silicide formation are selected to achieve silicide/non-silicide interface regions 305, 306, 307, 308 and 315, 316, 317, 318. In the source region 230, the source silicide region 290 interfaces the non-silicided portion of the source region 230 at a vertical interface region 305 and horizontal interface region 306 in the source extension 240, and at a vertical interface region 307 and horizontal interface region 308 in the source deep implant region 250. Similarly, in the drain region 232, the drain silicide region 292 interfaces the non-silicided portion of the drain region 232 at a vertical interface region 315 and horizontal interface region 316 in the drain extension 242, and at a vertical interface region 317 and horizontal interface region 318 in the drain deep implant region 252.

As is shown in FIG. 11A, the interface regions 305, 306 and 307 face the respective S/D junctions 280a, 280b and 280c, and the interface regions 315, 316 and 317 face the respective S/D junctions 282a, 282b and 282c. The conditions for formation of the silicide regions 290 and 292 in conjunction with the S/D junctions 280 and 282 are selected such that the vertical interface regions 305 and 315 of the suicide regions 290 and 292 are laterally spaced apart from the S/D junctions 280a and 282a by, for example, about 100 Angstroms (Å) to about 300 Angstroms (Å), the horizontal interface regions 306 and 316 of the silicide regions 290 and 292 are vertically spaced apart from the S/D junctions 280b and 282b by, for example, about 200 Angstroms (Å) to about 500 Angstroms (Å), and the vertical interface regions 307 and 317 of the suicide regions 290 and 292 are laterally spaced apart from the S/D junctions 280c and 282c by, for example, about 10 nm to about 20 nm.

Excess metal of the metal layer 284, for example, on the spacers 276 and 278, is removed by conventional, well-known means, thereby leaving the semiconductor device 210 shown in FIGS. 11 and 11A.

It will be appreciated that the placement of the suicide regions relative to the S/D junctions will be based on such factors as the selection of the width of the liners 270 and 272, the width of the spacers 246 and 248, the height of the source and drain raised regions 260 and 262, the thickness of the metal layers 274 and 284 and the corresponding depth (i.e., vertical height) of the source and drain silicide regions 290 and 292, and the depth and lateral width of the extensions 240 and 242.

According to the invention, the proximity of the silicide regions 290 and 292 and, more particularly, the respective interface regions 305, 306, 307, 308 and 315, 316, 317, 318 thereof, to the respective source/body and drain/body junctions 280 and 282 makes the junctions 280 and 282 "leaky", thus providing a path for carriers to reach the channel 244 of the device 210. This reduces floating body effects. As a result, overall operational performance of the device is improved. Also, depositing two different thickness metal layers 274 and 284 for the extensions 240 and 242 and the deep implant regions 250 and 252 during silicide formation facilitates locating the silicide regions 290 and 292 in close proximity to the respective source/body and drain body junctions 280 and 282. This differentiation in the silicide regions 290 and 292 substantially reduces contact resistance without losing the advantage of the reduced floating body effects.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A semiconductor device comprising:
   an SOI wafer including a semiconductor layer, a substrate and a buried insulator layer therebetween; the semiconductor layer including a source region, a drain region, and a body region disposed between the source and drain regions, the source and drain regions including respective source and extensions which extend partially laterally inwardly towards one another above the body region; and,
   a gate on the semiconductor layer disposed above the body region, the gate being operatively arranged with the source, drain, and body regions to form a transistor;
   wherein the source and drain regions include source and drain deep doped regions on opposite sides of and laterally spaced from the gate and laterally adjacent to the respective source and drain extensions, and wherein the source and drain extensions include respective source and drain silicide extension portions disposed therein of a first thickness and the source and drain deep doped regions include respective source and drain silicide deep portions disposed therein of a second thickness relatively thicker than the first thickness.

2. A semiconductor device as set forth in claim 1, further including liners disposed adjacent opposite sides of the gate.

3. A semiconductor device as set forth in claim 1, wherein the source and drain silicide extension portions in the respective source and drain extensions are laterally spaced apart from the body region by about 100 to about 300 Angstroms.

4. A semiconductor device as set forth in claim 1, wherein the source and drain silicide extension portions in the respective source and drain extensions are vertically spaced apart from the body region by about 200 to about 500 Angstroms.

5. A semiconductor device as set forth in claim 1, wherein the source and drain silicide deep portions in the respective source and drain deep doped regions are laterally spaced apart from the body region by about 10 nanometers to about 20 nanometers.

6. A semiconductor device as set forth in claim 1, wherein the vertical height of the source and drain epitaxially raised regions is between about 200 and about 500 Angstroms (Å).

7. A method of forming a semiconductor device comprising:
   forming an SOI wafer having a semiconductor layer, a substrate and a buried insulator layer therebetween, wherein the semiconductor layer includes a source region, a drain region, and a body region disposed between the source and drain regions, the source and drain regions including respective source and drain extensions which extend partially laterally inwardly towards one another above the body region;
   forming a gate on the semiconductor layer above the body region;
   forming source and drain deep doped regions on opposite sides of and laterally spaced from the gate and laterally adjacent to the respective source and drain extensions; and,
   forming source and drain silicide extension portions of a first thickness in the respective source and drain extensions and source and drain silicide deep portions of a second thickness relatively thicker than the first thickness in the respective source and drain deep doped regions.

8. A method as set forth in claim 7, wherein the step of forming the SOI wafer includes epitaxially raising the semiconductor layer on opposite sides of the gate to form source and drain epitaxially raised regions in the respective source and drain regions.

9. A method as set forth in claim 8, wherein the step of forming the epitaxially raised regions is such that the vertical height of the source and drain epitaxially raised regions is between about 200 and about 500 Angstroms (Å).

10. A method as set forth in claim 8, further including the step of forming liners adjacent opposite sides of the gate and forming spacers adjacent the respective liners before the step of forming the source and drain epitaxially raised regions.

11. A method as set forth in claim 10, further including the step of removing the spacers before the step of forming the source and drain silicide deep portions and source and drain silicide extension portions.

12. A method as set forth in claim 7, wherein the step of forming the source and drain silicide extension portions in the respective source and drain extensions is such that the silicide extension portions are laterally spaced apart from the body region by about 100 to about 300 Angstroms (Å).

13. A method as set forth in claim 7, wherein the step of forming the source and drain silicide extension portions in the respective source and drain extensions is such that the silicide extension portions are vertically spaced apart from the body region by about 200 to about 500 Angstroms (Å).

14. A method as set forth in claim 7, wherein the step of forming the source and drain silicide deep portions in the respective source and drain deep doped regions is such that the silicide deep portions are laterally spaced apart from the body region by about 10 nanometers to about 20 nanometers.

15. A method as set forth in claim 7, wherein the step of forming the source and drain silicide extension portions in the respective source and drain extensions includes depositing a first layer of metal having a first thickness on the respective source and drain extensions.

16. A method as set forth in claim 15, wherein the first thickness of the first metal layer is about three nanometers to about 10 nanometers.

17. A method as set forth in claim 15, wherein the step of forming the source and drain silicide deep portions in the respective source and drain deep doped regions includes depositing spacers on the first layer of metal having the first thickness above the source and drain extensions.

18. A method as set forth in claim 17, wherein the step of forming the source and drain silicide deep portions in the respective source and drain deep doped regions includes depositing a second layer of metal having a second thickness on the first layer of metal having the first thickness, the second thickness being greater than the first thickness.

19. A method as set forth in claim 18, wherein the second thickness of the second metal layer is about five nanometers to about 15 nanometers.

20. A method as set forth in claim 18, wherein the step of forming the source and drain silicide deep portions in the respective source and drain deep doped regions and forming the source and drain silicide extension portions in the respective source and drain extensions includes raising the semiconductor device to a predetermined temperature for a predetermined amount of time, whereby the source and drain suicide extension portions of the first thickness and the source and drain silicide deep portions of the second thickness are formed.

21. A method as set forth in claim 20, wherein the first metal and second metal are selected from the group of titanium, cobalt and nickel.

* * * * *